United States Patent
Mishima

(10) Patent No.: US 7,026,759 B2
(45) Date of Patent: Apr. 11, 2006

(54) LIGHT-EMITTING DEVICE HAVING SPECIFIC LINEAR THERMAL EXPANSION COEFFICIENT AND GAS BARRIER PROPERTIES

(75) Inventor: Masayuki Mishima, Kanagawa-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 12 days.

(21) Appl. No.: 10/395,189

(22) Filed: Mar. 25, 2003

(65) Prior Publication Data

US 2003/0178937 A1  Sep. 25, 2003

(30) Foreign Application Priority Data

Mar. 25, 2002  (JP) .............................. 2002-084432

(51) Int. Cl.
*H05B 33/04* (2006.01)
*H01J 1/62* (2006.01)

(52) U.S. Cl. ...................... 313/512; 313/504; 313/506; 428/690

(58) Field of Classification Search ................ 313/511, 313/512, 504–506; 428/690; 438/30

See application file for complete search history.

(56) References Cited

U.S. PATENT DOCUMENTS

| | | | | |
|---|---|---|---|---|
| 5,641,996 A | * | 6/1997 | Omoya et al. ............... | 257/787 |
| 5,981,306 A | * | 11/1999 | Burrows et al. ............... | 438/22 |
| 6,150,043 A | * | 11/2000 | Thompson et al. ......... | 428/690 |
| 6,268,695 B1 | * | 7/2001 | Affinito ....................... | 313/504 |
| 6,597,111 B1 | * | 7/2003 | Silvernail et al. ............ | 313/506 |
| 6,621,213 B1 | * | 9/2003 | Kawashima ................. | 313/506 |
| 6,664,137 B1 | * | 12/2003 | Weaver ....................... | 438/125 |
| 6,737,753 B1 | * | 5/2004 | Kumar et al. ................ | 257/787 |
| 2002/0113241 A1 | * | 8/2002 | Kubota et al. ................. | 257/79 |

FOREIGN PATENT DOCUMENTS

| | | |
|---|---|---|
| JP | 7-68690 A | 3/1995 |
| JP | 11-320744 A | 11/1999 |
| JP | 2001-60495 A | 3/2001 |
| JP | 2001-185348 A | 7/2001 |
| JP | 2002-25763 A | 1/2002 |
| WO | WO-WO 00/65670 A1 | 11/2000 |
| WO | WO 01/81649 A1 * | 11/2001 |

* cited by examiner

*Primary Examiner*—Karabi Guharay
*Assistant Examiner*—Sikha Roy
(74) *Attorney, Agent, or Firm*—Birch, Stewart, Kolasch & Birch, LLP

(57) ABSTRACT

A light-emitting device including an anode, one or more organic compound layers containing at least a light-emitting layer, and a transparent cathode on a flexible support substrate having a linear thermal expansion coefficient of 20 ppm/° C. or less, water permeability of 0.01 g/m²·day or less, and oxygen permeability of 0.01 cc/m²·day·atm or less. The flexible support substrate is constituted by a metal foil provided with an insulating layer on one or both surfaces thereof.

18 Claims, 1 Drawing Sheet

LIGHT-EMITTING DEVICE HAVING SPECIFIC LINEAR THERMAL EXPANSION COEFFICIENT AND GAS BARRIER PROPERTIES

FIELD OF THE INVENTION

The present invention relates to a light-emitting device usable for plate-shaped light sources such as full-color display devices, backlights and illumination light sources, light source arrays of printers, etc., particularly to a flexible, light-emitting device excellent in light-emitting luminance and durability.

BACKGROUND OF THE INVENTION

Promising as inexpensive, solid-emission-type, large-emission-area, full-color display devices and writing light source arrays, the organic, light-emitting devices have been actively developed. The organic, light-emitting device generally comprises a couple of electrodes, and a light-emitting layer formed therebetween. When an electric field is applied to both electrodes, electrons are injected from the cathode, while holes are injected from the anode. When electrons and holes are recombined in the light-emitting layer, whereby an energy level is lowered from a conduction band to a valence band, energy is turned to light, which is emitted from the organic, light-emitting device.

The conventional organic, light-emitting devices are disadvantageous in that they require high driving voltage for light emission and are poor in luminance and light-emitting efficiency. Some proposals have recently been provided to overcome the above disadvantages. For example, a light-emitting device comprising organic thin layers formed by vapor-depositing organic compounds is disclosed in Applied Physics Letters, 51, 913 (1987). This organic, light-emitting device has a two-layer laminate structure comprising an electron-transporting layer and a hole-transporting layer, exhibiting largely improved light-emitting properties than those of conventional organic, light-emitting devices having a single-layer structure. This organic, light-emitting device uses a low-molecular-weight amine compound as a hole-transporting material and 8-quinolinol aluminum complex (Alq) as an electron-transporting, light-emitting material, emitting green light. After this disclosure, many organic, light-emitting devices comprising vapor-deposited organic thin layers have been reported, as disclosed in Macromolecularly Symposium, 125, 1 (1997) and references therein, etc.

For the purpose of production cost reduction and application to flexible large-area devices such as backlights and illumination light sources, organic, light-emitting devices formed from high-molecular-weight, light-emitting compounds by a wet film-forming method have also been reported. As the high-molecular-weight, light-emitting compounds, there are, for instance, poly(p-phenylenevinylene) generating green light (Nature, Vol. 347, page 539, 1990), poly(3-alkylthiophene) generating reddish orange light (The Japanese Journal of Applied Physics, Vol. 30, page L 1938, 1991), polyalkylfluorene generating blue light (The Japanese Journal of Applied Physics, Vol. 30, page L1941, 1991), etc. Also, JP 2-223188 A reports an attempt to disperse low-molecular-weight, light-emitting compounds in binder resins, and wet-coat the resultant dispersion to form films.

However, in any of light-emitting devices produced by the above dry method and those produced by the above wet method, the use of a flexible, plastic substrate provides extremely lower durability than the use of a glass substrate. Accordingly, it has been considered difficult to provide commercially acceptable light-emitting devices by the wet method. One of the reasons therefor is that a plastic substrate of PET, etc. has such large gas permeability and moisture permeability that the penetrating oxygen and moisture exert adverse effects on the performance of the light-emitting device. When moisture exists in the light-emitting device, current flowing therein electrolyzes the moisture, generating a hydrogen gas and an oxygen gas and thus resulting in dark spots. In addition, because extremely easily oxidizable metals are used for the cathode, they are reacted with moisture and oxygen, causing dark spots.

Another reason is that because there is difference in a linear thermal expansion coefficient by one order or more between the flexible, plastic substrate and the electrode materials (ITO and metals), electrode materials tend to peel off from the substrate due to a thermal hysteresis, resulting in cracking and decrease in the durability of the light-emitting device.

A further reason is that because the substrate should be substantially transparent for the reason that the light-emitting device has a basis structure of substrate/anode/organic compound layer/cathode, in which the emitted light is taken out from the anode substrate side, there has not been developed yet a flexible support substrate that is transparent and has as high barrier properties to moisture and oxygen as those of glass. For instance, JP 2001-185348 A proposes a sealing layer comprising an insulating layer laminated with a metal layer to have high barrier properties to moisture and oxygen. However, this is a sealing layer that cannot be used as a substrate. Though JP 2001-60495 A and JP 11-320744 A describe the linear thermal expansion coefficients of barrier layers and protective films, they fail to describe the linear thermal expansion coefficients of flexible support substrates.

OBJECT OF THE INVENTION

Accordingly, an object of the present invention is to provide a flexible, light-emitting device excellent in durability, light-emitting efficiency and luminance, and usable for plate-shaped light sources such as full-color display devices, backlights and illumination light sources, light source arrays of printers, etc.

SUMMARY OF THE INVENTION

As a result of intense research in view of the above objects, the inventor has found that by utilizing a device structure (top emission-type), in which the emitted light is taken out from the opposite side to the substrate, and by using a flexible support substrate having as high gas barrier as that of glass, it is possible to obtain a flexible, light-emitting device having excellent luminance and durability. The present invention has been accomplished by this finding.

Thus, the light-emitting device of the present invention comprises an anode, one or more organic compound layers containing at least a light-emitting layer, and a transparent cathode on a flexible support substrate having gas barrier properties, the flexible support substrate having a linear thermal expansion coefficient of 20 ppm/° C. or less.

The flexible support substrate preferably has water permeability of 0.01 g/m$^2$·day or less and oxygen permeability of 0.01 cc/m$^2$·day·atm or less.

The flexible support substrate is preferably constituted by a metal foil provided with an insulating layer on one or both surfaces thereof. The metal foil is preferably an aluminum foil or a copper foil. The insulating layer is preferably made of a metal oxide and/or a metal nitride. Preferable specific examples of materials for the insulating layer include polyimides.

The flexible support substrate has a linear thermal expansion coefficient of preferably 10 ppm/° C. or less, more preferably 8 ppm/° C. or less.

The insulating layer is preferably made of a plastic selected from the group consisting of polyesters, polystyrenes, polycarbonates, polyether sulfones, polyarylates, allyldiglycolcarbonates, polyimides, polycycloolefins, norbornene resins and poly(chlorotrifluoroethylene).

The insulating layer constituted by a plastic sheet preferably has a thickness of about 10 to about 200 μm. The thickness of the metal foil is about 10 μm to about 100 μm. The thickness of the inorganic insulating layer is about 10 nm to about 1000 nm.

The insulating layer is preferably at least one of metal oxide and metal nitride.

The metal oxide is selected from the group consisting of silicon oxide, germanium oxide, zinc oxide, aluminum oxide and titanium oxide, and copper oxide, and wherein the metal nitride is selected from the group consisting of silicon nitride, germanium nitride and aluminum nitride.

The metal foil has an insulating layer made of plastics on one surface, and an insulating layer made of made of at least one of metal oxide and metal nitride on the other surface.

DETAILED DESCRIPTION OF THE PREFERRED EMBODIMENTS

Figure 1:
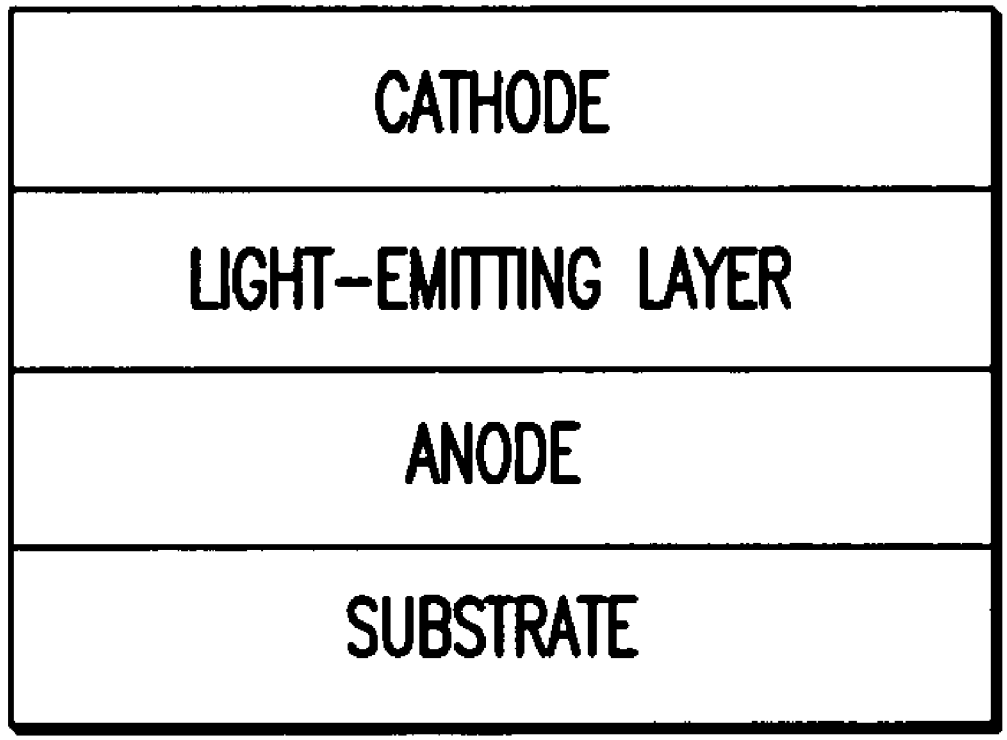
FIG. 1 is a schematic representation of the layer structure of the light-emitting device of the present invention.

As illustrated schematically in FIG. 1, the light-emitting device of the present invention has a layer structure comprising a flexible support substrate/an anode/an organic compound layer/a transparent cathode.

[1] Flexible Support Substrate (Support Substrate)

The support substrate used in the present invention has flexibility and gas barrier properties, and its linear thermal expansion coefficient is 20 ppm/° C. ($20 \times 10^{-6}$/° C.) or less, preferably 10 ppm/° C. or less, more preferably 8 ppm/° C. or less. The linear thermal expansion coefficient is a change ratio of the length of a sample when heated at a constant speed, which is determined from measurement results by a thermomechanical analysis (TMA) method. When the linear thermal expansion coefficient is larger than 20 ppm/° C., cracking and peeling may occur in an electrode at the time of heating during a thermal hysteresis, whereby the durability of the light-emitting device is likely to be deteriorated. Materials having linear thermal expansion coefficients of 20 ppm/° C. or less include metal foils such as an aluminum foil, a copper foil, a stainless steel foil, a gold foil, a silver foil, and plastic sheets made of polyimides, liquid crystal polymers, etc.

The support substrate preferably has water permeability of 0.01 g/m²·day or less, and oxygen permeability of 0.01 cc/m²·day·atm or less. The water permeability may be measured by a method according to JIS K 7129B (1992), typically by an MOCON method (isostatic method). The oxygen permeability may be measured by a method according to JIS K 7126B (1987), typically by an MOCON method (isostatic method). With the water permeability and oxygen permeability of the support substrate kept at the above levels, it is possible to prevent moisture and oxygen causing the deterioration of durability from entering into the light-emitting device.

As a flexible support substrate satisfying the above property conditions without short-circuiting when producing a light-emitting device with an electrode, a substrate constituted by a metal foil provided with an insulating layer on one or both surfaces thereof is preferable. The metal foil is not particularly restrictive but may be an aluminum foil, a copper foil, a stainless steel foil, a gold foil, a silver foil, etc. preferable among them from the aspects of the easiness of working and cost is an aluminum foil or a copper foil. The metal foil is preferably as thick as 10 to 100 μm. When the metal foil is thinner than 10 μm, the resultant support substrate has large moisture and oxygen permeability, resulting in poor gas barrier properties, leading to a light-emitting device with poor durability. On the other hand, when the metal foil is thicker than 100 μm, the resultant support substrate has insufficient flexibility, resulting in inconvenience in handling.

Though not particularly restrictive, the insulating layer bonded to one or both surfaces of the metal foil may be made, for instance, of inorganic materials such as inorganic oxides, inorganic nitrides, etc.; plastics such as polyesters (polyethylene terephthalate, polybutylene terephthalate, polyethylene naphthalate, etc.), polystyrenes, polycarbonates, polyether sulfones, polyarylates, allyldiglycolcarbonates, polyimides, polycycloolefins, norbornene resins, poly (chlorotrifluoroethylene), etc. Because a metal cathode is formed on the insulating layer, it is preferable that the insulating layer has a linear thermal expansion coefficient close to those of the metal cathode and the metal foil. From this aspect, too, the insulating layer preferably has a linear thermal expansion coefficient of 20 ppm/° C. or less. If larger than this, cracking and peeling take place while heating, causing the deterioration of durability.

As the inorganic, insulating layer having a linear thermal expansion coefficient of 20 ppm/° C. or less, metal oxides such as silicon oxide, germanium oxide, zinc oxide, aluminum oxide, titanium oxide, copper oxide; metal nitrides such as silicon nitride, germanium nitride, aluminum nitride are preferable, which may be-used alone or in combination.

The thickness of the inorganic, insulating layer is preferably 10 nm to 1000 nm. When the inorganic, insulating layer is thinner than 10 nm, it provides only low insulation. On the other hand, when the inorganic, insulating layer is thicker than 1,000 nm, cracking easily occurs in the support substrate, resulting in pinholes and thus decrease in insulation.

The method for forming the insulating layer from metal oxides and/or metal nitrides is not particularly restrictive, but dry methods such as a vapor deposition method, a sputtering method, a CVD method, etc., wet methods such as a sol-gel method, etc., coating methods using dispersions of particles of metal oxides and/or metal nitrides in solvents, etc. may be used.

As plastic materials for the insulating layer having a linear thermal expansion coefficient of 20 ppm/° C. or less, polyimide is particularly preferable. When polyimide is used for the insulating layer, a polyimide sheet is preferably laminated with an aluminum foil. The polyimide sheet preferably has a thickness of 10 to 200 μm. When the polyimide sheet is thinner than 10 μm, handling is difficult at the time of lamination. On the other hand, when the polyimide sheet is thicker than 200 μm, the flexibility is deteriorated, resulting in inconvenience in handling.

Though the insulating layer may be formed only on one surface of the metal foil, it may be formed on both surfaces. When formed on both surfaces, any of the insulating layers on both surfaces may be made of metal oxides and/or metal nitrides, or may be a plastic insulating layer such as a polyimide sheet. Alternatively, the insulating layer on one surface is made of metal oxides and/or metal nitrides, while the insulating layer on the other surface is an insulating polyimide sheet.

The support substrate thus produced as described above is small in both water permeability and oxygen permeability and has excellent flexibility. The shape, structure, size, etc. of the flexible support substrate is not particularly restrictive, but may be properly selected depending on the applications, purposes, etc. of the light-emitting device. The support substrate is generally in a plate shape.

[2] Anode

The anode need only have a function as a usual anode supplying holes to the organic compound layer, and its shape, structure, size, etc. are not particularly restrictive but may be properly selected from those of known electrodes depending on the applications and purposes of the light-emitting device.

Materials for the anode may be, for instance, metals or their alloys, metal oxides, electrically conductive, organic compounds, or mixtures thereof, preferably having a work function of 4 eV or more. Specific examples of the materials for the anode include conductive metal oxides such as antimony-doped tin oxide (ATO), fluorine-doped tin oxide (FTO), tin oxide, zinc oxide, indium oxide, indium tin oxide (ITO), indium zinc oxide (IZO); metals such as gold, silver, chromium and nickel; mixtures and laminates of the metals and conductive metal oxides; inorganic, conductive compounds such as copper iodide and copper sulfide; dispersions of conductive metal oxides or metal compounds; organic, conductive compounds such as polyaniline, polythiophene and polypyrrole; laminates of the organic, conductive compounds and ITO; etc.

The method for forming the anode on the support substrate may be appropriately selected from wet methods such as a printing method and a coating method; physical methods such as a vacuum deposition method, a sputtering method and an ion-plating method; chemical methods such as a CVD method and a plasma CVD method; etc., depending on the materials used therefor. For example, when the anode is made of ITO, it may preferably be formed by a DC or RF sputtering method, a vapor deposition method, an ion-plating method, etc. In addition, when the anode is made of an organic, conductive compound, it may be formed by a wet method. The anode is preferably formed by a wet method from the aspects of increase in the area of the light-emitting device and productivity.

The patterning of the anode layer may be conducted by a chemical etching method such as a photolithography method, a physical etching method using laser beams, a vacuum vapor deposition method or a sputtering method with a mask, a lift-off method, a printing method, etc.

The thickness of the anode layer may be properly controlled depending on the material used therefor. The thickness of the anode layer is generally 10 nm to 50 μm, preferably 50 nm to 20 μm. The resistance of the anode is preferably $10^6$ Ω/square or less, more preferably $10^5$ Ω/square or less. In the case of $10^5$ Ω/square or less, the formation of bus line electrodes can provide a large-area, light-emitting device with excellent performance. Because the emitted light is taken out from a transparent cathode in the light-emitting device of the present invention, the anode may be colorless transparent, colored transparent or opaque.

[3] Organic Layer (Organic Compound Layer)

The organic compound layer is constituted by one or more layers including at least a light-emitting layer. The specific layer structure of the light-emitting device of the present invention may be as follows:

(a) Anode/light-emitting layer/transparent cathode;
(b) Anode/light-emitting layer/electron-transporting layer/transparent cathode;
(c) Anode/hole-transporting layer/light-emitting layer/electron-transporting layer/transparent cathode;
(d) Anode/hole-transporting layer/light-emitting layer/transparent cathode;
(e) Anode/light-emitting layer/electron-transporting layer/electron-injecting layer/transparent cathode; and
(f) Anode/hole-injecting layer/hole-transporting layer/light-emitting layer/electron-transporting layer/electron-injecting layer/transparent cathode; etc.

(1) Light-emitting layer

The light-emitting layer comprises at least one light-emitting material, and may contain, if necessary, a hole-transporting material, an electron-transporting material and a host material. The light-emitting material is not restrictive as long as it is a fluorescent compound or a phosphorescent compound.

Examples of the fluorescent compound used in the present invention include benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; light-emitting polymer materials such as polythiophene derivatives, polyphenylene derivatives, polyphenylenevinylene derivatives and polyfluorene derivatives; etc. The fluorescent compounds may be used alone or in combination.

The phosphorescent compound is preferably an ortho-metallated complex or a porphyrin complex.

The ortho-metallated complexes used in the present invention may be such compounds that are described in Akio Yamamoto, "Metalorganic Chemistry, Foundation and Application," pages 150 to 232, Shokabo Publishing Co., Ltd., (1982); H. Yersin, "Photochemistry and Photophysics of Coordination Compounds," pages 71 to 77 and 135 to 146, Springer-Verlag, Inc. (1987), etc. The organic compound layer comprising such an ortho-metallated complex is excellent in luminance and light-emitting efficiency.

Ligands forming the ortho-metallated complexes are described in the above references. Preferable ligands among them include 2-phenylpyridine derivatives, 7,8-benzoquinoline derivatives, 2-(2-thienyl)pyridine derivatives, 2-(1-naphthyl) pyridine derivatives and 2-phenylquinoline derivatives, etc. If necessary, the derivatives may have substituents. The ortho-metallated complexes may have other ligands than the above ligands.

The ortho-metallated complexes used in the present invention may be synthesized by known methods disclosed in Inorg. Chem., 30, 1685, 1991; Inorg. Chem., 27, 3464, 1988; Inorg. Chem., 33, 545, 1994; Inorg. Chim. Acta, 181, 245, 1991; J. Organomet. Chem., 335, 293, 1987; J. Am. Chem. Soc., 107, 1431, 1985; etc.

Preferable among the ortho-metallated complexes are compounds emitting light from triplet excitons from the aspect of improvement in light-emitting efficiency. Preferable among the porphyrin complexes is a porphyrin-platinum complex. The phosphorescent compounds may be used alone or in combination. The fluorescent compound and the phosphorescent compound may be used together. From the aspects of luminance and light-emitting efficiency, it is preferable to use the phosphorescent compound.

Though not restrictive, the hole-transporting materials may be low- or high-molecular-weight materials if they have any of functions of injecting holes from the anode, transporting holes and blocking electrons from the cathode. Examples of the hole-transporting materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive oligomers such as oligothiophenes, electrically conductive polymers such as polythiophene derivatives, polyphenylene derivatives, polyphenylenevinylene derivatives, polyfluorene derivatives, etc. These hole-transporting materials may be used alone or in combination. The content of the hole-transporting materials in the light-emitting layer is preferably 0 to 99.9% by mass, more preferably 0 to 80% by mass.

The electron-transporting materials are not particularly limited as long as they have any of functions of transporting electrons and blocking holes from the anode. Examples of the electron-transporting materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having skeleton structures such as naphthaleneperylene, phthalocyanine derivatives, 8-quinolinol metal complexes and derivatives thereof, metallophthalocyanines, metal complexes containing a benzoxazole or benzothiazole ligand, aniline copolymers, electrically conductive oligomers such as oligothiophenes, electrically conductive polymers such as polythiophene derivatives, polyphenylene derivatives, polyphenylenevinylene derivatives, polyfluorene derivatives, etc. The content of the electron-transporting materials in the light-emitting layer is preferably 0 to 99.9% by mass, more preferably 0 to 80% by mass.

The host compound is a compound causing energy transfer from its excited state to the light-emitting compound, resulting in accelerating the light emission of a light-emitting compound such as a fluorescent compound and a phosphorescent compound. The host materials may be appropriately selected depending on the purposes without particular restrictions, as long as they are compounds capable of moving exciton energy to the light-emitting materials. Specific examples of the host compounds include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, anthraquinodimethane derivatives, anthrone derivatives, diphenylquinone derivatives, thiopyran dioxide derivatives, carbodimide derivatives, fluorenylidenemethane derivatives, distyrylpyrazine derivatives, anhydrides derived from heterocyclic tetracarboxylic acids having skeleton structures such as naphthaleneperylene, phthalocyanine derivatives, 8-quinolinol metal complexes and derivatives thereof, metallophthalocyanines, metal complexes containing a benzoxazole or benzothiazole ligand, polysilane compounds, poly(N-vinylcarbazole) derivatives, aniline copolymers, electrically conductive oligomers such as oligothiophenes, electrically conductive polymers such as polythiophene derivatives, polyphenylene derivatives, polyphenylenevinylene derivatives, polyfluorene derivatives, etc. The host compounds may be used alone or in combination. The content of the host compound in the light-emitting layer is preferably 0 to 99.9% by mass, more preferably 0 to 99.0% by mass.

As other components in the light-emitting layer, electrically inactive polymer binders may be used if necessary. Examples of the electrically inactive polymer binders include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The light-emitting layer containing a polymer binder is advantageous to be formed with a large area by the wet film-forming method.

(2) Other Organic Compound Layer

The light-emitting device of the present invention may be provided with other organic compound layers, if necessary. For instance, a hole-injecting layer and a hole-transporting layer may be inserted between the anode and the light-emitting layer, and an electron-transporting layer and an electron-injecting layer may be inserted between the light-emitting layer and the cathode. The above hole-transporting materials may be used for the hole-transporting layer and the hole-injecting layer, and the above electron-transporting materials may be used for the electron-transporting layer and the electron-injecting layer.

(3) Formation of Organic Compound Layer

The organic compound layer may be formed by any of methods of dry film-forming methods such as a vapor deposition method and a sputtering method; wet film-forming methods such as a dipping method, a spin coating method, a dip-coating method, a casting method, a die-coating method, a roll-coating method, a bar-coating method and a gravure-coating method; transferring methods; and printing methods. The film-forming methods may be appropriately selected depending on the materials of the organic compound layer.

Among them, the wet film-forming methods are advantageous in that they can easily form a large-area, organic compound layer, thereby efficiently providing the light-emitting device with high luminance and excellent light emission efficiency at a low cost. In the case of the wet film-forming methods, drying is properly carried out after the formation of film layers. Though the drying conditions are not particularly restrictive, such conditions as temperature, etc. are preferably selected such that coated layers are not damaged.

When the organic compound layer is formed by a wet film-forming method, it is preferable to add a binder resin to the organic compound layer. Examples of the binder resins include polyvinyl chloride, polycarbonates, polystyrene, polymethyl methacrylate, polybutyl methacrylate, polyesters, polysulfones, polyphenylene oxide, polybutadiene, hydrocarbon resins, ketone resins, phenoxy resins, polyamides, ethyl cellulose, polyvinyl acetate, ABS resins, polyurethanes, melamine resins, unsaturated polyesters, alkyd resins, epoxy resins, silicone resins, polyvinyl butyral, polyvinyl acetal, etc. The binder resins may be used alone or in combination.

In the wet forming of the organic compound layer, solvents used for the preparation of coating liquids by dissolving materials for the organic compound layer are not particularly restrictive, but may be properly selected depending on the types of the hole-transporting materials, the orthometallated complexes, the host materials, the polymer binders, etc. Specific examples of the solvents include halogen solvents such as chloroform, tetrachloromethane, dichloromethane, 1,2-dichloroethane and chlorobenzene; ketone solvents such as acetone, methyl ethyl ketone, diethyl ketone, n-propyl methyl ketone and cyclohexanone; aromatic solvents such as benzene, toluene and xylene; ester solvents such as ethyl acetate, n-propyl acetate, n-butyl acetate, methyl propionate, ethyl propionate, γ-butyrolactone and diethyl carbonate; ether solvents such as tetrahydrofuran and dioxane; amide solvents such as dimethylformamide and dimethylacetamide; dimethylsulfoxide; water; etc.

A solid content of the coating solution for the organic compound layer is not particularly restrictive, and its viscosity may be arbitrarily selected depending on a wet film-forming method. When the other organic compound layers are easily soluble in solvents, lamination is difficult. Accordingly, it is preferable to use a transfer method to form the organic compound layer.

[4] Transparent Cathode

The transparent cathode need only function as an electrode injecting electrons into the organic compound layer, and be substantially transparent to light, without particular restrictions in its shape, structure, size, etc. Known electrodes may be properly selected as the transparent cathode depending on the applications and purposes of the light-emitting device.

Though the transparent cathode may have a single-layer structure, it preferably has a two-layer structure consisting of a thin metal layer and a transparent, conductive layer, to meet both requirements of electron injection and transparency. Metals or alloys thereof used for the thin metal layer preferably have a work function of 4.5 eV or less. Examples of the materials used for the transparent cathode include alkali metals such as Li, Na, K and Cs; alkaline earth metals such as Mg and Ca; gold; silver; lead; aluminum; a sodium-potassium alloy; a lithium-aluminum alloy; a magnesium-silver alloy; indium; rare earth metals such as ytterbium; etc. Although the materials may be used alone, the rear-surface electrode is preferably made of a plurality of materials to improve both of stability and electron injection property.

Preferable among the above materials are alkali metals and alkaline earth metals from the viewpoint of the electron injection property, and aluminum-based materials from the viewpoint of stability during storage. Usable as the aluminum-based materials are aluminum itself and aluminum-based alloys and mixtures containing 0.01 to 10% by mass of alkali metals or alkaline earth metals, such as a lithium-aluminum alloy, a magnesium-aluminum alloy, etc.

The materials of thin metal layers usable for the transparent cathode are disclosed in JP 2-15595 A and JP 5-121172 A. The thin metal layer preferably has a thickness of 1 nm to 50 nm. When the thickness of the thin metal layer is less than 1 nm, it is difficult to form a uniformly thin metal layer. On the other hand, when the thickness of the thin metal layer exceeds 50 nm, the transparency of the thin metal layer decreases.

When the transparent cathode has a two-layer structure, materials used for the transparent, conductive layer are not particularly restrictive as long as they are transparent materials having conductivity or semi-conductivity, and the materials used for the above anode may suitably be used. Preferable among them are, for instance, antimony-doped tin oxide (ATO), fluorine-doped tin oxide (FTO), tin oxide, zinc oxide, indium oxide, indium tin oxide (ITO), indium zinc oxide (IZO), etc. The thickness of the transparent, conductive layer is preferably 30 nm to 500 nm. When the transparent, conductive layer is thinner than 30 nm, it is poor in conductivity or semi-conductivity. On the other hand, when it is thicker than 500 nm, the productivity is poor.

The formation method of the transparent cathode is not restrictive, but known methods may be used, though it is preferably carried out in a vacuum apparatus. It may be properly selected, for instance, from physical methods such as a vacuum deposition method, a sputtering method and an ion-plating method; chemical methods such as a CVD method and a plasma CVD method; etc, taking into consideration adaptability with the materials of the transparent cathode. For instance, when metals are selected as cathode materials, thin cathodes can be formed by sputtering one or more metals simultaneously or successively.

The patterning of the transparent cathode may be conducted by a chemical etching method such as a photolithography method, a physical etching method using laser beams, a vacuum vapor deposition method or a sputtering method with a mask, a lift-off method, a printing method, etc.

A dielectric layer may be formed between the transparent cathode and the organic compound layer. The dielectric layer may be made of a fluorinated alkali or alkaline earth metal, having a thickness of 0.1 nm to 5 nm. The dielectric layer may be formed by a vacuum vapor deposition method, a sputtering method, an ion-plating method, etc.

[5] Other Layers

Other layers such as a protective layer, etc. may properly be included depending on applications and purposes of the light-emitting device.

Preferable examples used as the protective layer are described in JP 7-85974 A, JP 7-192866 A, JP 8-22891 A, JP 10-275682 A, JP 10-106746 A, etc. The protective layer may be made of any material that can prevent substances such as water and oxygen degrading the function of the light-emitting device from entering or penetrating into the device. Silicon monoxide, silicon dioxide, germanium monoxide, germanium dioxide, etc. may be used for the protective layer. The shape, size and thickness of the protective layer may be selected depending on applications and purposes.

Though not restrictive, the protective layer may be formed by a vacuum deposition method, a sputtering method, an activated sputtering method, a molecular beam epitaxy method, a cluster ion beam method, an ion-plating method, a plasma polymerization method, a plasma CVD method, a laser CVD method, a thermal CVD method, a coating method, etc.

A sealing layer is preferably formed in the light-emitting device to prevent water and oxygen from entering or permeating into each layer of the device. Examples of materials for the sealing layer include copolymers of tetrafluoroethylene and at least one comonomer, fluorine-containing copolymers having cyclic structures in their main chains, polyethylene, polypropylene, polymethyl methacrylate, polyimides, polyureas, polytetrafluoroethylene, polychlorotrifluoroethylene, polydichlorodifluoroethylene, copolymers of chlorotrifluoroethylene or dichlorodifluoroethylene, moisture-resistant substances having a water absorption of 0.1% or less, metals such as In, Sn, Pb, Au, Cu, Ag, Al, Ti and Ni, metal oxides such as MgO, SiO, $SiO_2$, $Al_2O_3$, GeO, NiO, CaO, BaO, $Fe_2O_3$, $Y_2O_3$ and $TiO_2$, metal fluorides such as $MgF_2$, LiF, $AlF_3$ and $CaF_2$, liquid fluorinated solvents such as perfluoroalkanes, perfluoroamines and perfluoroethers, dispersions prepared by adding substances for adsorbing moisture or oxygen to liquid fluorinated solvents, etc.

Further, a water-absorbing agent or an inert liquid may be filled between the light-emitting structure and the sealing parts. Though not restrictive, the water-absorbing agents may be barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, zeolite, magnesium oxide, etc. Though not restrictive, the inert liquids may be paraffins, liquid paraffins, fluorine-containing solvents such as perfluoroalkanes, perfluoroamines and perfluorethers; chlorine-containing solvents; a silicone oil, etc.

The light-emitting device of the present invention may emit light by applying DC voltage or current to the anode and the cathode. DC voltage is generally 2 to 40 V and may contain an AC component, if necessary. Driving methods for the light-emitting devices are described in detail in JP 2-148687 A, JP 6-301355 A, JP 5-29080 A, JP 7-134558 A, JP 8-234685 A, JP 8-241047 A, U.S. Pat. Nos. 5,828,429 and 6,023,308, Japanese Patent 2,784,615, etc.

The present invention will be explained in further detail by Examples below without intention of restricting the scope of the present invention defined by the claims attached hereto.

EXAMPLE 1

A 50-μm-thick polyimide film (UPILEX-50S, available from Ube Industries, Ltd.) was laminated onto both surfaces of a 5-cm-each aluminum foil (thickness: 30 μm) by an adhesive, to produce a support substrate. TMA measurement indicated that the support substrate had a linear thermal expansion coefficient of 10 ppm/° C. The support substrate also had water permeability of 0.01 g/m²·day or less (MOCON method, 25° C., 90% RH), and oxygen permeability of 0.01 cc/m²·day·atm or less (MOCON method, 25° C., 0% RH).

A 250-nm-thick ITO layer with an indium/tin molar ratio of 95/5 was formed on this support substrate by a DC magnetron sputtering method to produce an anode. The anode had resistance of 7 Ω/square.

N,N'-dinaphthyl-N,N'-diphenylbenzidine was vapor-deposited on this anode in vacuum at a speed of 1 nm/second, to produce a 0.04-μm-thick, hole-transporting layer. Tris(2-phenylpyridine)iridium complex as an ortho-metallated complex, and 4,4'-N,N'-dicarbazole-biphenyl as a host material were vapor-deposited on this hole-transporting layer at speeds of 0.1 nm/second and 1 nm/second, respectively, to obtain a 0.024-μm-thick, light-emitting layer made of phosphorescent materials.

2,2',2"-( 1,3,5-benzenetriyl)tris[3-(2-methylphenyl)-3H-imidazo[4,5-b]pyridine] was vapor-deposited as an electron-transporting material on this light-emitting layer at a speed of 1 nm/second, to produce a 0.024-μm-thick, electron-transporting layer. A 3-nm-thick LiF layer was formed by a vapor deposition method on the organic compound layer thus obtained, to produce an electron-injecting layer.

Further, Al was vapor-deposited in a thickness of 10 nm to form a thin metal layer for a transparent cathode. A 200-nm-thick ITO layer with an indium/tin molar ratio of 95/5was formed thereon by a DC magnetron sputtering method to form a transparent, conductive layer, thereby obtaining a transparent cathode.

Aluminum lead wires were connected to the anode and the cathode, respectively. A sealing film was formed by silicon nitride by a sputtering method to cover other portions than the lead wires.

A light-emitting device thus obtained was evaluated by the following method. DC voltage was applied to each organic EL device by Source-Measure Unit 2400 available from Toyo Corporation to cause light emission. $L_{max}$ represents the maximum luminance, and $V_{max}$ represents voltage when $L_{max}$ was obtained. The light-emitting efficiency ($\eta_{200}$) at 200 Cd/m² was regarded as external quantum efficiency. The results are shown in Table 1.

As a continuous driving test, this light-emitting device was caused to continuously emit light at an initial luminance of 200 Cd/m², to measure a time period ($t_{1/2}$), in which the luminance became half. As a storing test under humid and hot conditions, after the light-emitting device was stored under the conditions of 85° C. and 90% RH for 30 days, the maximum luminance $L_{max(30)}$, and voltage $V_{max(30)}$ at $L_{max(30)}$ were measured. The results are shown in Table 1.

EXAMPLE 2

A light-emitting device was produced and evaluated in the same manner as in Example 1 except for using a copper foil (thickness: 50 μm) in place of the aluminum foil. The results are shown in Table 1. The TMA measurement indicated that the support substrate had a linear thermal expansion coefficient of 8 ppm/° C. The support substrate also had water permeability of 0.01 g/m²·day or less (MOCON method, under the same conditions as in Example 1), and oxygen permeability of 0.01 cc/m²·day·atm or less (MOCON method, under the same conditions as in Example 1).

EXAMPLE 3

A light-emitting device was produced and evaluated in the same manner as in Example 1 except for using as an insulating layer a sputtered silicon oxide film (thickness: 30 nm) in place of the polyimide sheet. The results are shown in Table 1. The TMA measurement indicated that the support substrate had a linear thermal expansion coefficient of 5 ppm/° C. The support substrate also had water permeability of 0.01 g/m²·day or less (MOCON method, under the same conditions as in Example 1), and oxygen permeability of 0.01 cc/m²·day·atm or less (MOCON method, under the same conditions as in Example 1).

EXAMPLE 4

A support substrate was produced in the same manner as in Example 1, except for laminating the same polyimide sheet as in Example 1 on one surface of an aluminum foil and forming a silicon nitride layer (thickness: 50 nm) on the other surface of the aluminum foil by a sputtering method as insulating layers, instead of laminating polyimide sheets on both surfaces of the aluminum foil, and then forming a transparent cathode, an organic compound layer and an anode on the side of the silicon nitride insulating layer to produce a light-emitting device. The resultant light-emitting device was evaluated in the same manner as in Example 1. The results are shown in Table 1. The TMA measurement indicated that the support substrate had a linear thermal expansion coefficient of 3 ppm/° C. The support substrate also had water permeability of 0.01 g/m²·day or less (MOCON method, under the same conditions as in Example 1), and oxygen permeability of 0.01 cc/m²·day·atm or less (MOCON method, under the same conditions as in Example 1).

EXAMPLE 5

A light-emitting device was produced in the same manner as in Example 1, except for forming a silicon oxide layer (thickness: 40μm) only on one surface of the aluminum foil as an insulating layer by a sputtering method instead of laminating polyimide sheets both surfaces of the aluminum foil. A transparent cathode, an organic compound layer and an anode were formed on the side of the silicon oxide layer. The resultant light-emitting device was evaluated in the same manner as in Example 1. The results are shown in Table 1. The TMA measurement indicated that the support substrate had a linear thermal expansion coefficient of 10 ppm/° C. The support substrate also had water permeability of 0.01 g/m²·day or less (MOCON method, under the same conditions as in Example 1), and oxygen permeability of 0.01 cc/m²·day·atm or less (MOCON method, under the same conditions as in Example 1).

COMPARATIVE EXAMPLE 1

A light-emitting device was produced in the same manner as in Example 1 except for using a 50-μm-thick PET sheet available from Teijin Limited in place of a polyimide sheet as an insulating layer adhered to both surfaces of the aluminum foil. This light-emitting device was evaluated in the same manner as in Example 1. The results are shown in Table 1.

As is clear from Table 1, though this light-emitting device exhibited substantially the same initial properties as those of Examples, it was extremely poor in storing properties under humid and hot conditions, and many dark spots particularly due to the peeling of a cathode from the PET sheet were observed. The TMA measurement indicated that the support substrate had as large a linear thermal expansion coefficient as 55 ppm/° C. The support substrate also had water permeability of 0.01 g/m²·day or less (MOCON method, under the same conditions as in Example 1), and oxygen permeability of 0.01 cc/m²·day·atm or less (MOCON method, under the same conditions as in Example 1).

COMPARATIVE EXAMPLE 2

A light-emitting device was produced and evaluated in the same manner as in Example 1 except for using a support substrate constituted only by a 50-μm-thick polyimide sheet (UPILEX-50S, available from Ube Industries, Ltd.). The results are shown in Table 1. As is clear from Table 1, though this light-emitting device exhibited substantially the same initial properties as those of Examples, it was extremely poor in continuous driving properties and storing properties under humid and hot conditions, and many dark spots were observed. The TMA measurement indicated that the support substrate had a linear thermal expansion coefficient of 10 ppm/° C. The support substrate also had water permeability of 1.5 g/m²·day (MOCON method, in the same manner as in Example 1), and oxygen permeability of 2.5 cc/m²·day (MOCON method, in the same manner as in Example 1), both of them being large.

TABLE 1

| No. | $L_{max}$ (Cd/m²) | $V_{max}$ (V) | $\eta_{200}$ (%) | $t_{1/2}$ (hours) | $L_{max(30)}$ (Cd/m²) | $V_{max(30)}$ (V) |
|---|---|---|---|---|---|---|
| Example 1 | 68,000 | 12 | 15.1 | 3,800 | 52,000 | 14 |
| Example 2 | 65,000 | 12 | 14.8 | 3,500 | 50,000 | 14 |
| Example 3 | 67,000 | 12 | 14.0 | 3,500 | 49,000 | 14 |
| Example 4 | 58,000 | 13 | 14.9 | 3,700 | 51,000 | 15 |
| Example 5 | 56,000 | 12 | 14.5 | 3,500 | 48,000 | 14 |
| Com. Ex. 1 | 48,000 | 15 | 12.5 | 1,100 | 3,400 | 34 |
| Com. Ex. 2 | 9,000 | 20 | 8.1 | 110 | 850 | 35 |

As explained above in detail, because the light-emitting device of the present invention has a structure in which the emitted light is taken out from the opposite side to a substrate, using a flexible support substrate having as high gas barrier as that of glass and a linear thermal expansion coefficient of 20 ppm/° C. or less, it has excellent durability, light-emitting efficiency and luminance. Such light-emitting device is usable for plate-shaped light sources such as full-color display devices, backlights and illumination light sources, light source arrays of printers, etc.

What is claimed is:

1. A light-emitting device comprising, in the following order,
   a flexible support substrate comprising a metal foil having a thickness of 10 to 100 μm and provided with an insulating layer that has a linear thermal expansion coefficient of 20 ppm/° C. or less on one or both surfaces thereof, said flexible support substrate having a linear thermal expansion coefficient of 20 ppm/° C. or less, a water permeability of 0.01 g/m²·day or less, and an oxygen permeability of 0.01 cc/m²·day·atm or less,
   an anode,
   at least one organic layer containing a light-emitting layer, and
   a transparent cathode.

2. The light-emitting device of claim 1, wherein said flexible support substrate comprises a metal foil provided with an insulating layer on one surface thereof.

3. The light-emitting device of claim 1, wherein said flexible support substrate comprises a metal foil provided with an insulating layer on both surfaces thereof.

4. The light-emitting device of claim 3, wherein said metal foil has an insulating layer made of plastics on one surface, and an insulating layer made of made of at least one of metal oxide and metal nitride on the other surface.

5. The light-emitting device of claim 4, wherein said metal foil has an insulating layer made of polyimide on one surface and an insulating layer made of at least one of metal oxide and metal nitride on the other surface.

6. The light-emitting device of claim 1, wherein said flexible support substrate has a linear thermal expansion coefficient of 10 ppm/° C. or less.

7. The light-emitting device of claim 1, wherein said flexible support substrate has a linear thermal expansion coefficient of 8 ppm/° C. or less.

8. The light-emitting device of claim 1, wherein said metal foil is selected from the group consisting of an aluminum foil, a copper foil, a stainless steel foil, a gold foil and a silver foil.

9. The light-emitting device of claim 8, wherein said metal foil is an aluminum foil or a copper foil.

10. The light-emitting device of claim 8, wherein said insulating layer is made of a plastic selected from the group consisting of polyesters, polystyrenes, polycarbonates, polyether sulfones, polyarylates, allyldiglycolcarbonates, polyimides, polycycloolefins, norbornene resins and poly(chlorotrifluoroethylene).

11. The light-emitting device of claim 8, wherein said insulating layer is at least one of metal oxide and metal nitride.

12. The light-emitting device of claim 11, wherein said metal oxide is selected from the group consisting of silicon oxide, germanium oxide, zinc oxide, aluminum oxide, titanium oxide and copper oxide, and wherein said metal nitride is selected from the group consisting of silicon nitride, germanium nitride and aluminum nitride.

13. The light-emitting device of claim 1, wherein said insulating layer is made of a plastic selected from the group consisting of polyesters, polystyrenes, polycarbonates, polyether sulfones, polyarylates, allyldiglycolcarbonates, polyimides, polycycloolefins, norbornene resins and poly(chlorotrifluoroethylene).

14. The light-emitting device of claim 13, wherein said insulating layer is made of a polyimide.

15. The light-emitting device of claim 13, wherein said insulating layer constituted by a plastic sheet has a thickness of about 10 to about 200 μm.

16. The light-emitting device of claim 1, wherein said insulating layer is an inorganic insulating layer and is at least one of metal oxide and metal nitride.

17. The light-emitting device of claim 16, wherein said metal oxide is selected from the group consisting of silicon oxide, germanium oxide, zinc oxide, aluminum oxide and titanium oxide, and copper oxide, and wherein said metal nitride is selected from the group consisting of silicon nitride, germanium nitride and aluminum nitride.

18. The light-emitting device of claim 1, wherein the insulating layer is an inorganic insulating layer and the thickness of the inorganic insulating layer is about 10 nm to about 1000 nm.

* * * * *